United States Patent [19]

Mosnier

[11] 4,027,234

[45] May 31, 1977

[54] DEVICE FOR MEASURING TERRESTRIAL MAGNETIC FIELD HORIZONTAL COMPONENTS AND VARIATIONS THEREOF

[75] Inventor: Jean Paul Mosnier, Massy, France

[73] Assignee: Etat Francais, France

[22] Filed: Apr. 21, 1975

[21] Appl. No.: 569,849

[30] Foreign Application Priority Data

May 6, 1974 France .............................. 74.15502

[52] U.S. Cl. ................................................ 324/48
[51] Int. Cl.$^2$ ...................................... G01R 33/02
[58] Field of Search ........................... 324/43 R, 48

[56] References Cited

UNITED STATES PATENTS 2,151,627   3/1939   Vacquier .................... 324/43 R

FOREIGN PATENTS OR APPLICATIONS 258,643   1/1966   U.S.S.R. .......................... 324/43 R

OTHER PUBLICATIONS

Bobrov, N., Quartz–H–Magnetometer, Geomagnetic & Aeronomy, vol. 9, No. 6 (1969) pp. 922–924.
Burtsev, Y. Method of Recording Field Variations, Geomagnetic & Aeronomy, vol. 10, No. 3 (1969), pp. 443–444.
Bobrov, V., Quartz Magnetic Variometer, Geomagnetism & Aeronomy, vol. 10, No. 3 (1969) pp. 445–446.

Primary Examiner—Robert J. Corcoran
Attorney, Agent, or Firm—Larson, Taylor and Hinds

[57] ABSTRACT

A device is provided for the determination of the components of a terrestrial magnetic field as well as transitory variations therein. Two variometers including permanent magnets, mounted so that there is a constant angle between them, detect the magnetic field. A calculation system is provided for the determination of the direction and magnitude of each compensating field generated by the two variometers. Proper operation of the calculation system is assured without regard to the orientation of the device with respect to the magnetic north pole. Accordingly, the device may be used in any orientation and is thus suitable for use in such locations as the ocean floor. According to a preferred embodiment of the invention, the two variometers are mounted at right angles to each other.

7 Claims, 7 Drawing Figures

DEVICE FOR MEASURING TERRESTRIAL MAGNETIC FIELD HORIZONTAL COMPONENTS AND VARIATIONS THEREOF

FIELD OF THE INVENTION

The present invention relates to a device for measurement of the horizontal components of the terrestrial magnetic field, as well as their transitory variations.

BACKGROUND OF THE INVENTION

Measurement of the intensity of the terrestrial magnetic field and that of its transitory variations has had practical application for some time, especially in geophysical prospecting (mineral or petroleum). This is true also of measurements of the north-south, east-west and vertical components of the terrestrial magnetic field.

Such measurements made on the ocean floor offer wide perspectives, for example, for the exploitation of the continental plateau, but such an application introduces more practical difficulties than for a similar measurement on land.

The measurement of the total intensity, commonly denoted F, of the magnetic field is relatively easy to effect with nuclear resonance or optical pumping magnetometers, which are practically insensitive to the direction of the probe. The situation is quite different in the measurement of horizontal components which previously has required a precise orientation of the sensor in a given direction. As example, U.S. Pat. No. 3,508,142 describes a magnetometer for measurement of variations of the east-west component, commonly denoted D, on the ocean bottom. The applicant in the above mentioned U.S. patent also described this magnetometer in the article by J. H. Filloux entitled "An Ocean Bottom D Component Magnetometer" which appeared in the U.S. journal *Geophysics*, vol. 32, no. 6, December 1967. However, this magnetometer does not provide for measurements of the north-south component, commonly denoted H.

SUMMARY OF THE INVENTION

According to the present invention, a device is provided that allows simultaneous measurement of the two horizontal components, D and H, of the terrestrial magnetic field, and of their variations with respect to time.

In this device, sensors can be utilized that are similar to the slaved-magnet variometers described by J. Mosnier in a first article entitled "Sensitive variometer for the study of declination: theoretical paper" which appeared in the French journal *Annales de geophysique*, vol. 26, 1970, and in a second article written in collaboration with P. Yvetot, appearing in *Annales de geophysique*, vol. 28, 1972. These variometers have performed efficiently for submarine measurements, though divers are required to set the sensor in vertical position, and to provide proper orientation, thereby limiting its use to shallow depths. While it is possible to conceptualize a technique for automatic orientation of the variometer so as to avoid reliance on human intervention, the need to avoid use of any magnetic elements or devices (motor, relay etc.) in the immediate vicinity of the sensor presents extremely hard problems in implementing such techniques.

Before describing the invention, it is noted that a slaved-magnet variometer is a magnetometer with a permanent magnet in which the magnet is oriented according to a directional field, and serves to measure the components of perturbations of the terrestrial field that are perpendicular to the directional field. In the course of the measurement, the magnet exposed to the directional field plus the perturbations is held to its original orientation by the superposition of a compensatory counter-reaction field normal to the directional field, that tends to cancel the normal component to be measured. This component is determined by measuring the electric current that the compensatory field generates. It should also be noted that it is known that sensors mounted on a cardan suspension and associated with a counterweight can be used to ensure the verticality of the sensors, i.e., practically speaking, the verticality of the wire by which the magnet is suspended.

According to the invention, a measuring device is provided comprising two slaved-magnet variometers whose directional fields are oriented along two directions that describe a constant angle between them, a device for generating in each variometer a primary compensation field that compensates the horizontal component of the terrestrial magnetic field that is normal to the direction of the directional field of the variometer, an electrical current creating the primary associated field of compensation, and computational device to determine, as a function of the two measurements of current and the angle of the directional fields, the magnitude of the horizontal component of the terrestrial magnetic field and its direction with reference to the device.

According to a preferred embodiment of the invention, the constant angle between the two directional fields of the two variometers is a right angle. In addition, means are provided to generate in each variometer a secondary field of compensation parallel to the direction of the directional field of the variometer in question, the magnitude of the secondary field of compensation of one of the variometers being equal to the magnitude of the primary field of compensation of the other, and vice versa, so as to compensate equally in each variometer the horizontal component of the terrestrial magnetic field parallel to the directional field.

A detection device is also provided which initially detects, prior to the application of the directional fields to the variometers, the direction of the magnets when they are released from their rest positions oriented in the respective directions of the directional fields and subjected to the terrestrial magnetic field, and then deduces the directions of the primary compensation fields from the detected directions of rotation.

The device also comprises apparatus to vary the magnitude of the primary compensation fields, which are operative after the means of detection have determined the direction of the primary fields of compensation, and which are locked in the positions they have reached when the detectors indicate that the primary fields of compensation are respectively equal in magnitude to the horizontal components that are to be compensated.

Another further feature of the device of the invention here comprises a computational device that receives the measurements of the counter-reaction compensation fields, once the primary and secondary compensatory fields and the directional fields have been established, and records the measurements of the variations of the horizontal components of the terrestrial magnetic field.

Other features and advantages of the invention will be set forth in, or apparent from, the detailed description of a preferred embodiment described hereinbelow.

DESCRIPTION OF A PREFERRED EMBODIMENT

Figure 1:
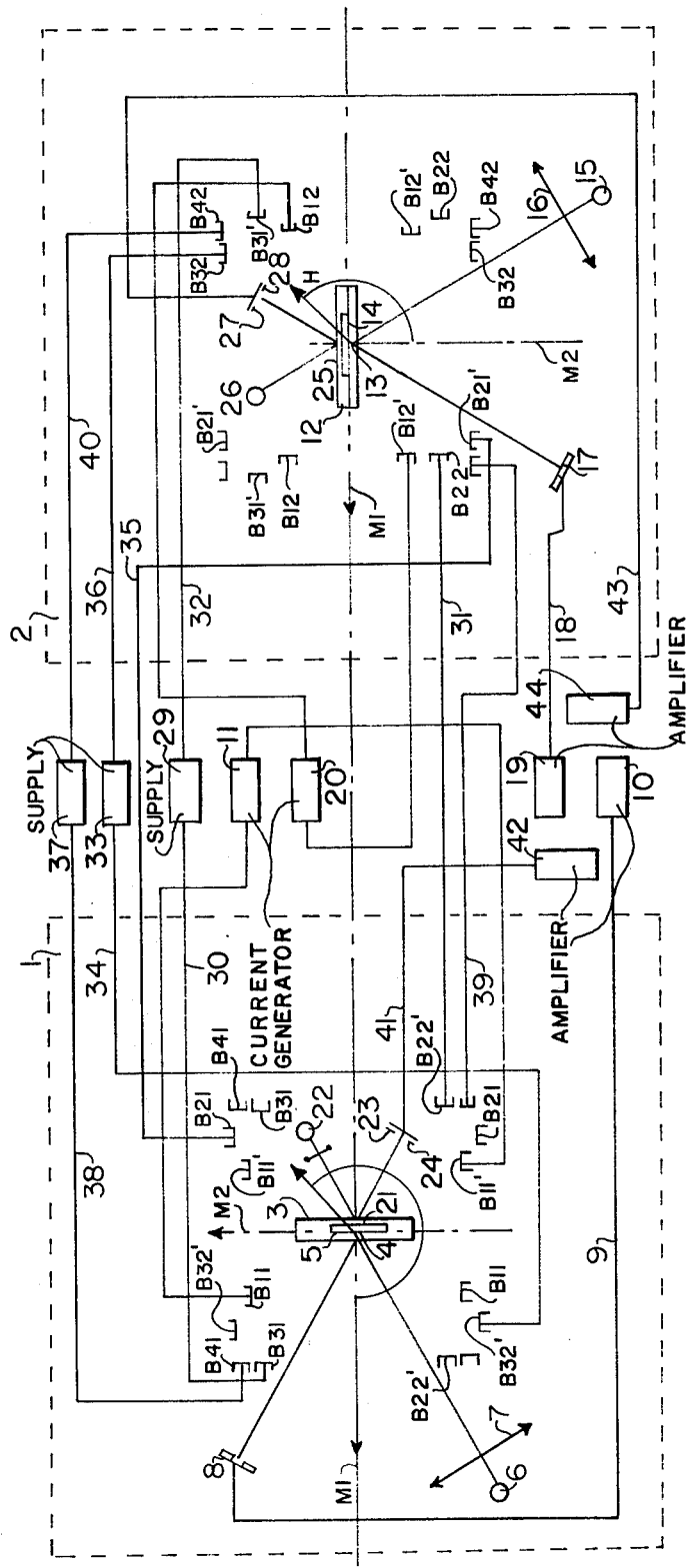
FIG. 1 is a schematic diagram of a measurement device according to the invention.

Referring to FIG. 1, a measurement device according to the invention is shown, comprising two variometers denoted 1 and 2 that are rigidly joined by suitable means (not shown).

Variometer 1 comprises a magnet in the form of a bar 3 suspended at its center by a torsionless wire 4, seen in end view. Suitable means (not shown) are provided to hold variometer 1 horizontal, and a mirror 5 is rigidly connected to magnet 3. A punctate or linear source of light 6 illuminates mirror 5 through a collimating lens 7, and the light reflected by mirror 5 impinges on a system of photocells 8, whose output current is substantially in proportion to the angle of rotation of mirror 5, i.e, of magnet 3. The current delivered by photocells 8 is applied through a connection 9 to an amplifier 10 whose output signal is applied, by means of circuitry illustrated in FIG. 3, to a current generator 11. Current generator 11 serves to energize Helmholtz coils B11, thereby creating a counter-reaction (feedback) compensation field at the level of the magnet, restoring the magnet to its initial position. As will become evident from the subsequent discussion, the feedback compensation field monitors the variations in the terrestrial field after the latter has been compensated. It is to be noted that these elements, and this operation are known, and hence they are simply presented schematically. In operation, the magnet obviously has to be exposed to a directional field, denoted Hol, whose mean direction is fixed. Perturbations that present components normal to Hol tend to cause magnet 3 to turn, the magnet 3 being drawn back by the counterreaction field, which is added to the normal components to cancel them. The measurement of the current furnished by generator 11 makes it possible to calculate the value of the normal components. It is obvious that the components of the perturbations, which are parallel to Hol, i.e., to magnet 3, have no action on the latter and cannot be measured. It is to be noted that direction indicated by arrow M1, normal to mirror 5, is referred to as the zero alignment of the variometer.

Figure 4:
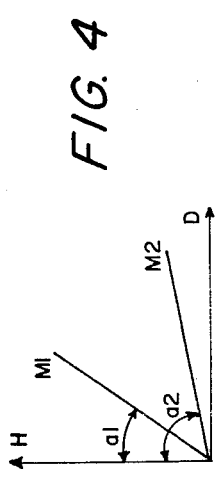
FIG. 4 is a diagram that illustrates a calculation according to the invention.
Figure 2A:
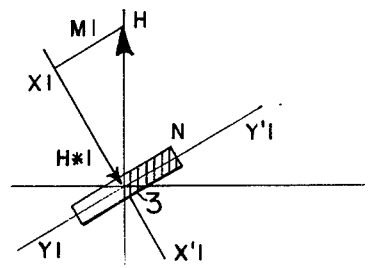
FIGS. 2a through 2d are diagrams illustrating the four positions that the device can assume with reference to the terrestrial magnetic field.
Figure 2A:
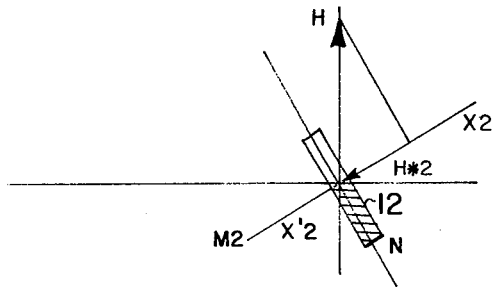
Figure 2B:
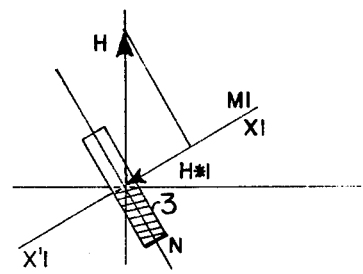
Figure 2B:
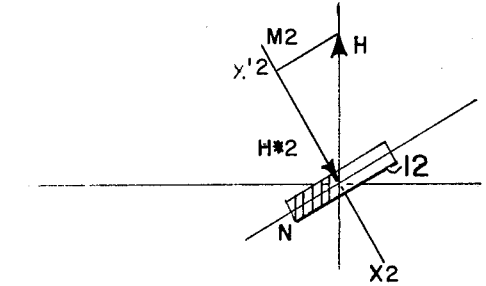
Figure 2C:
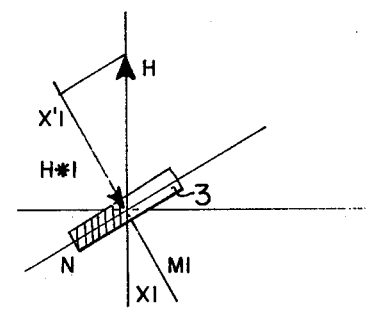
Figure 2C:
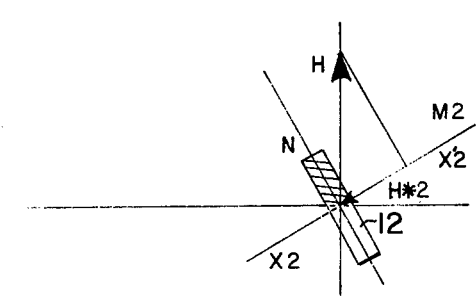
Figure 2D:
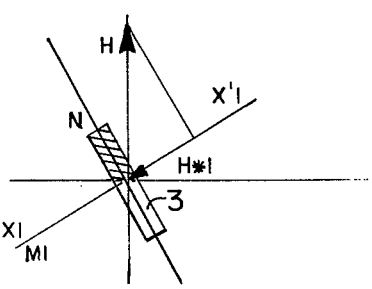
Figure 2D:
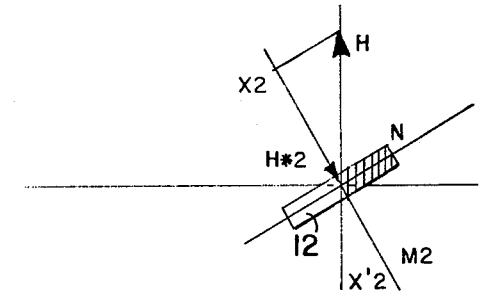

In U.S. Pat. No. 3,508,142 mentioned above, the directional field is the horizontal north-south H component of the terrestrial magnetic field, so only measurement of east-west variations, dD, is possible, i.e., it is not possible to measure north-south variations dH. If, however, the mean horizontal component of the magnetic field is compensated for in the two variometers, which are placed substantially at the same point, and two directional fields are created, defining the direction M1 of alignment zero for the former and direction M2 of zero alignment for the latter, as indicated in FIG. 4, it will be possible to measure the variations of the magnetic field in these two directions. Referring to FIG. 4, if the letters $a1$ and $a2$ are used respectively to designate the angles that the directions M1 and M2 make with magnetic north, and $d1$ and $d2$ are used to designate the signals furnished respectively by the two variometers, then $$d1 = dH \cos a1 + dD \sin a1$$

$$d2 = dH \cos a2 + dD \sin a2$$

If $a1$ and $a2$ are known, measurement of $d1$ and $d2$ permit calculation of $dH$ and $dD$.

Disposing the two variometers along two perpendicular directions, further reduces the above equations to:

$$d1 = dH \cos a1 + dD \sin a1$$

$$d2 = dH \sin a1 - dD \cos a1 \text{ (with } a1 = a2 + (\pi/2))$$

from which is derived the relationships:

$$dH = d1 \cos a1 + d2 \sin a1$$

$$dD = d1 \sin a1 - d2 \cos a1.$$

In the device shown in FIG. 1, it is assumed that variometers 1 and 2 have their zero alignments perpendicular, alignment M1 making angle $a1$ with direction H and alignment M2 making angle $a2$.

Variometer 2 comprises elements that are identical to those of 1, to wit, a magnetized bar 12, a torsionless wire 13, a mirror 14, a light source 15, a lens 16, a photocell system 17, a connection 18 connecting photocell system 17 to an amplifier 19, and a current generator 20 for energizing Helmholtz coils B12 so as to create the ccounter-reaction (feedback) field.

Variometer 1 is supplemented by coils B21, which are intended to create a field compensating the component of the terrestrial field perpendicular to the directional field by coils B31, which are intended to create a field compensating the component parallel to the directional field, and by coils B41 which are intended to create directional field Hol. Variometer 2 includes similar coils B22, B32 and B42.

Variometer 1 also comprises a mirror 21 on the back of mirror 5, mirror 21 receiving light from a light source 22, and directing this light onto a system of two photocells 23 and 24. This optical system is much less precise than the one that comprises mirror 5, source 6 and light receiver system 17, and is only used to adjust the variometer, as described hereinbelow. Similarly, and for the same purpose, variometer 2 has a mirror 25 on the back of 14, a source 16 and a system of two photocells 27 and 28.

In operation, the device described above is lowered to the ocean floor where magnets 3 and 12 take some position with reference to magnetic north. In FIGS. 2a through 2d, the four possible positions that the device can take with reference to north-south component H of the terrestrial field are shown. FIGS. 2a through 2d show the direction from $x1$ to $x'1$, and the direction from $x2$ to $x'2$ is referred to as the positive direction. The symbols H*1 an H*2 indicate the fields necessary to compensate the components perpendicular to the axes of bars 3 and 12 respectively, and the signs of these fields, which are a function of position, are indicated by the following table 1:

| TABLE 1 | | | | TABLE 2 | | | |
| --- | --- | --- | --- | --- | --- | --- | --- |
| Figure | Position | H*1 | H*2 | Figure | Position | D1 | D2 |
| 2a | I | + | + | 2a | I | + | + |
| 2b | II | + | − | 2b | II | + | − |
| 2c | III | − | − | 2c | III | − | − |
| 2d | IV | − | + | 2d | IV | − | + |

If a deviation of the north pole of the magnet toward the west under the action of only the H component is referred to as positive, then the initial deviations, denoted D1 and D2, of bars 3 and 12, are a function of the position as shown by Table 2 hereinabove.

Therefore, by measuring the initial deviations of bars 3 and 12, it is possible to deduce the signs of compensatory fields H*1 and H*2, because tables 1 and 2 are identical.

It is possible in variometer 2 to compensate for the component of the terrestrial field parallel to y2–y'2, creating a compensatory field equal to H*1, i.e., applying to coils B32 the same current as into coils B21 of variometer 1. Similarly, in variometer 1, it is possible to compensate the component parallel to y1–y'1, by applying the same current to coils B31 as to coils B22 of variometer 2.

Thus, in FIG. 1, there is shown a supply box 29 connected to a terminal of coils B31 by connection 30, the other terminal of B31, i.e., the terminal of coils B22, being connected to a terminal of coils B22 by connection 31, and the other terminal of B22 being connected by a return connection 32 to box 29. Similarly, starting from a supply box 33 there is a circuit comprising a connection 34, coils B21, a connection 35, coils B32 and a connection 36. A third supply box 37 is provided, to transmit the current necessary to create the directional fields Ho1 and Ho2 in variometers 1 and 2, the distributor circuit comprising supply box 37, a connection 38, coils B41, a connection 39 between unnumbered coils, coils B42, and a connection 40.

In variometer 1, photocells 23 and 24 are connected by a two-wire connection 41 to a double amplifier 42, and, similarly, in variometer 2, photocells 27 and 28 are connected by a two-wire connection 43 to a double amplifier 44.

Figure 3:
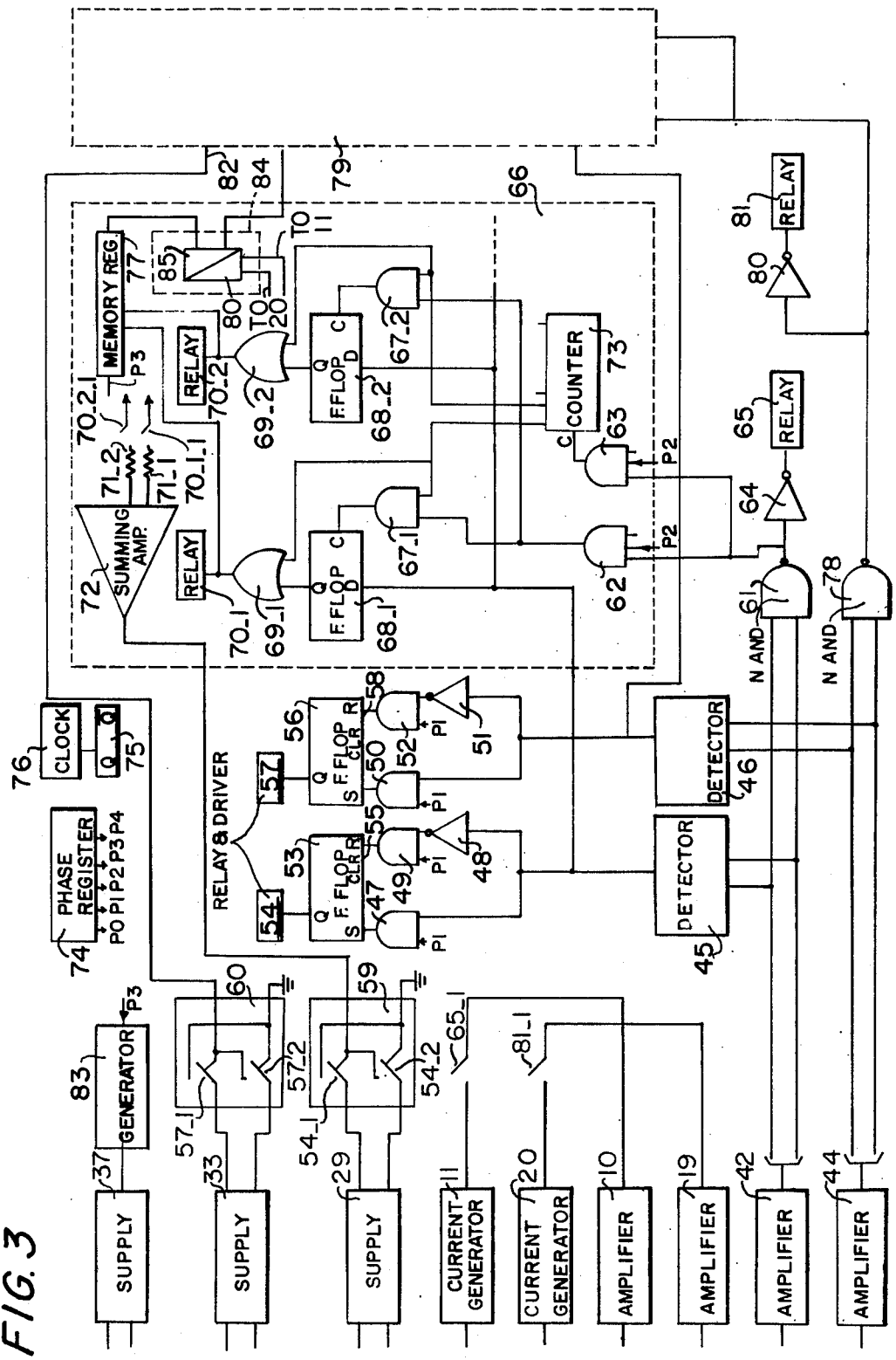
FIG. 3 shows a block diagram of the control circuits of the device of FIG. 1.

Referring to FIG. 3, there is shown the control circuitry for the device shown in FIG. 1. This control circuit comprises supply boxes 11, 20, 29, 33 and 37, and amplifiers 10, 19, 42 and 44, which are also included in FIG. 1. In practice, the control circuitry is several meters distant from variometers 1 and 2 of FIG. 1, because the circuitry contains electromagnetic relays that could affect the variometers if located in close proximity thereto.

The outputs of double amplifier 42 supply a detector 45 which is capable, as a function of the signals generated by photocells 23 and 24, of determining if magnet 3 has initially turned in one direction or the other. When magnet 3 turns in one direction, detector 45 generates a binary 1 output signal and when magnet 3 turns in the opposite direction, detector 45 generates a binary 0 output signal. Similarly, the outputs of amplifier 44 supply a detector 46 similar to detector 45, which delivers a binary 1 or 0, depending upon the direction of the rotation of magnet 12. The output of detector 45 is connected to the first input of an AND gate 47 and to the input of an inverter 48 whose output is connected to the first input of an AND gate 49. The output of detector 46 is connected to the first input of an AND gate 50, and to the input of an inverter 51 whose output is connected to the first input of an AND gate 52. The output of gate 47 is connected to the set input of a flip-flop 53 whose output is connected across a power amplifier (not shown) to the coil of a relay 54. The output of gate 49 is connected to reset input of flip-flop 53 which has a clear input 55 for asynchronous zero reset. The output of gate 50 is connected to set input of a flip-flop 56 whose output 1 is connected across a power amplifier (not shown) to the coil of a relay 57. The output of gate 52 is connected to reset input of flip-flop 56, which has a clear input 58 for asynchronous zero reset. Relay 54 has two contacts 54.1 and 54.2 connected to form an inverter 59 and relay 57 has two contacts 57.1 and 57.2 connected to form an inverter 60.

The outputs of amplifier 42 are also connected respectively to the two inputs of a NAND gate 61 which thus delivers a signal as long as a single photocell of photocells 23 and 24 emits a signal, but delivers a 0 signal if both cells produce an output, that is, if magnet 3 is set properly. The output of gate 61 is connected to the first inputs of two-three input AND gates 62 and 63, and is also connected to the input of an inverter 64 whose output drives a relay 65. Relay 65 has a contact 65.1 which is wired so that amplifier 10 is connected to generator 11 when relay 65 is energized.

Gates 62 and 63 are part of the compensation control circuit 66. In this circuit, the output of gate 62 is connected in parallel to the first inputs of a series of AND gates 67.1, 67.2 and so on. The output of AND gate 67.1 is connected to the clock input of a D type flip-flop 68.1, which is the first of a series of similar flip-flops. Flip-flop 68.1 includes, in addition to its clock input, a D input for data, receiving binary signals 1 or 0 from the output of detector 45, and a signal output Q. When the clock input is activated, the signal applied to the data input is placed in the memory, and the flip-flop delivers a corresponding output signal so long as it is not reset to zero by an asynchronous clear input that is not illustrated. The output of 68.1 is connected to the first input of an OR gate 69.1 whose output is connected through a power amplifier circuit (not shown) to the coil of a relay 70.1. Similarly, the output of the AND gate 67.2 is connected to the clock input of flip-flop 68.2 whose data input is connected to the output of detector 45, and whose output is connected to the first input of an OR gate 69.2 whose output is connected to an amplifier circuit (not shown) which drives the coil of a relay 70.2. The relays 70.1, 70.2 etc., respectively have their working contacts 70.1.1, 70.2.1 etc., located between a source of potential and resistors 71.1, 71,2 etc., the other terminals of which are connected to the corresponding inputs of a current summing amplifier 72.

The output of gate 63 is connected to the count or advance input of a counter 73 which comprises as many binary stages as there are flip-flops 68. The outputs of counter 73 are respectively connected to the second inputs of AND gates 67.1, 67.2 etc. and to the second inputs of OR gates 69.1, 69.2 etc.

The second inputs of the two AND gates 62 and 63 are connected to output p2 of a phase register or timing circuit 74 which delivers sequential clocking pulses on output lines P0 through P4 and whose operation is described hereinbelow. The third input of AND gate 62 is connected to the Q output of a monostable circuit 75 triggered by pulses from a clock 76 that produces a clock (periodic) pulse about every 10 seconds. When each pulse is received, the output Q of monostable circuit 75 switches to logical state 1 for a brief instant, and then returns to state 0. Output Q of monostable circuit 75 is connected to the third input of AND gate 63.

The outputs of gates 69.1, 69.2 etc. are respectively connected to the corresponding inputs of a memory register 77 that comprises a read input connected to output P3 of phase register 74.

The outputs of amplifier 44 are also connected to the two inputs of a NAND gate 78 whose output is connected to a circuit 79 which is similar to the circuitry enclosed by dashed line block 66, and to the input of an inverter 80 whose output energizes a relay 81 that has its operative contact 81.1 connected between the output of amplifier 19 and the input of generator 20.

The output of summing amplifier 72 is connected to one of the input leads of inverter 59 whereof the other is grounded. Similarly, the compensation control circuit 79 has an output lead 82 from a summing amplifier therein (not shown) which is connected to inverter 60.

Output P0 of phase register 74 is connected to the zero reset inputs 55 and 58 of the memories 53 and 56 respectively. Output P1 of 74 is connected to the second inputs of gates 47, 49, 50 and 52. Output P3 is also connected to the input of a current generator 83 that supplies box 37.

The operation of the control circuits shown in FIG. 3 will now be described, assuming that the device of FIG. 1 has been let down to the ocean floor along an orientation to magnetic north that is unknown. Initially, register 74 is in its 0 phase and the control circuits are inoperative. In particular, contacts 65.1 and 81.1 are open, thus disconnecting the counter-reaction compensation system. During phase 0, a buoy floating on the surface transmits a command signal that provides freeing of magnets 3 and 12 which are normally locked in a rest position and when freed move to positions in which they can rotate. This aspect of the operation forms no part of the invention and can be effected in a number of different, conventional ways. Once the magnets 3 and 12 have been released and subjected to the terrestrial magnetic field, register 74 shifts to phase 1 operation and gates 47, 49, 50 and 52 open, allowing signals applied to their first inputs to pass therethrough. As described hereinabove with reference to table 2, these signals correspond to the directions of deviation of magnets 3 and 12 subjected to the terrestrial magnetic field combined with the directional fields produced from box 37 by coils B41 and B42. It is to be noted that in this initial phase the directional fields have amplitudes that are slightly greater than that of the terrestrial field, to avoid any reversing of the magnets.

If the two magnets shown in FIG. 1 turn counterclockwise, photocells 23 and 27 are active and photocells 24 and 28 are not. Under these conditions detectors 45 and 46 each deliver a signal that sets flip-flops 53 and 56 to the one state because inverters 48 and 51 inhibit the reset inputs of these flip-flops. Relays 54 and 57 are energized and actuate inverters 59 and 60 by their respective contacts 54.1, 54.2, 57.1 and 57.2 which orient the feed currents in supply boxes 29 and 33 so that the primary compensatory fields have the correct direction. This corresponds to the situation of line number 1 to Table 2, and the directions of the compensatory fields are selected to correspond to line number 1 of Table 1. There is the same line-to-line correspondence for the three other cases. Phase 1 corresponds, therefore, to the selection of the directions of the compensatory fields.

After a certain lapse of time corresponding to the delay for the above selection, register 74 shifts to phase 2 operation, which has no influence whatsoever on the choice just made, because flip-flops 53 and 56 remain in the states that they have assumed. Gates 47, 49, 50 and 52 now being closed, there is no further need to fear perturbations. Gates 61 and 78 both deliver a binary one signal, because one of their inputs is in state 0. Although the operation of the control circuit is described below with respect to variometer 1, the description is similarly applicable to variometer 2 as well.

Considering this operation, the output of detector 45 is in state 1. The first two inputs of gate 63 are thus determined, as well as the third, by inoperative monostable circuit 75. The first output of counter 73 is determined and delivers an output signal that energizes relay 70.1 across OR gate 69.1. Relay 70.1 connects resistor 71.1 into the circuit. Summing amplifier 72 then delivers a current that creates a compensation field, causing magnet 3 to turn, or not to turn.

It is to be noted that the values of resistors 71 decrease in a geometric progression. For example, eight resistors may be used to produce eight elementary compensatory fields whose weight varies from P8 to P2, with $P8 = 2P7$, $P7 = 2P6$, etc., P2 being equal to $2P1$ where $P1 = 100$ gamma. Assuming that the terrestrial field Ho is of the order of 20,000 gamma, it is possible to create a total field of $255 \times 100 = 25,500$ gamma with the eight resistors. It is thus possible to compensate the terrestrial field even in the most unfavorable conditions, and the 200 gamma increment corresponds to the range of values in which the counter-reaction system comprising current generators 11 and 20 can compensate for the errors.

Assuming that the compensation provided by connecting resistor 71.1 into the circuit is too great, magnet 3 turns enough so that photocell 23 will no longer be illuminated. However, photocell 24 will be illuminated and will emit a signal. The output of detector 45 delivers a 0 which is applied to flip-flop 68.1. At the moment when clock 76 delivers a pulse to monostable circuit 75, output Q thereof opens AND gate 62 which energizes the clock input of flip-flop 68.1, which records the 0 coming from detector 45. As soon as monostable circuit 75 returns to state 0, counter 73, receiving a new pulse from AND gate 63, advances one step. OR gate 69.1 no longer delivers a signal because the first output of counter 73 is not activated, and 68.1 delivers a 0. Relay 70.1 is de-energized thereby disconnecting resistor 71.1. The second output of counter 73 actuates relay 70.2 across OR gate 69.2. Regsitor 71.2 is made operative, and the operation continues in a manner similar to that described above with respect to resistor 71.1.

Considering the opposite condition, i.e., that the compensation effected by resistor 71.1 is too weak, the output of detector 45 delivers a logical 1, which is applied to the input of flip-flop 68.1. The pulse delivered by clock 76 causes recording of this state in flip-flop 68.1 which, when counter 73 has advanced by one step, keeps relay 70.1 operative through OR gate 69.1.

Thus the successive energizing of resistors 71.1, whereof some remain operative, permits rapid convergence to the desired compensatory field. It is obvious that resistors having another distribution of values could be adopted, but the one that has been described appears to provide the most rapid operation on the average.

It is to be observed that if the correct compensation is arrived at before the utilization of the last resistors, this would be detected by gate 61 which would no longer deliver an output signal, because photocells 23 and 24 are illuminated simultaneously. Inverter 64 then energizes relay 65 which closes contact 65.1 and the automatic counter-reaction compensation begins operation.

In an alternative embodiment (not shown), a coincidence detector would detect the simultaneous functioning of relays 65 and 81 when variometers 1 and 2 are adjusted, and cause phase register 74 to shift to phase 3. This advance can also be effected after some delay.

While shifting to phase 3, generator 83 divides the current of box 37 by two in order to preserve a directional field that is only half the terrestrial field, thereby improving the sensitivity of the variometers. The output current of box 37 can obviously be divided into other proportions.

In a further alternative embodiment (not shown), memory 77 copies the states of the outputs of OR gates 69.1, i.e., bits that correspond to operational resistors 71, the binary word recorded therein indicating the value of the compensatory field.

In phase 4, variometers 1 and 2 transmit their measurements to the buoy associated with the device, i.e., the values of the currents furnished by generators 11 and 20, as described in the Journal articles mentioned hereinabove. Memory 77, as well as corresponding memory 79 may also transmit their contents to the buoy.

If $n1$ and $n2$ are the two numbers stored in memories 77 and 79 respectively, and if $H_1^+$ and $H_2^+$ the created compensatory fields, and K is a constant, then:

$$H_1^+ = Ho \cos a1 = kn1$$

$$H_2^+ = Ho \sin a1 = kn2$$

wherefrom is derived the relationship:

$$Ho = k(n1^2 + n2^2)^{1/2}$$

Thus, the intensity of the Ho component of the terrestrial field, from knowledge of $n1$ and $n2$, is readily determinable from these relationships, the following further relationships can be derived:

$$\cos a1 = \frac{n1}{(n1^2 + n2^2)^{1/2}}$$

and $$\sin a1 = \frac{n2}{(n1^2 + n2^2)^{1/2}}$$

Furthermore, by means of the values d1 and d2 furnished by the variometers, dH and dD can be calculated with the formulas mentioned hereinabove.

A buoy, which is indicated schematically by dashed line box 84 which contains a first computing or calculation means 85 and a second computing or calculation mens 86. The first calculation means 85 is connected to memory 77 and to memory 79 which respectively deliver the numbers $n1$ and $n2$. Thus, calculation means 85 is able to produce the outputs Ho and cos a1 and sin a1 based on the formulas previously set forth. As illustrated, the second calculation means 86 is connected to respective current generators 11 and 20 which deliver data signals directly proportional to the feedback compensation currents produced thereby. The second means produces the outputs dH and dD based on the formulas previously referred to.

Though the principles of the present invention have been described above with reference to a specific embodiment, it must be understood that this description was only presented as an example and does not limit the scope of the invention.

I claim:

1. A device for the measurement of terrestrial magnetic field horizontal components and variations thereof, said device comprising:

first and second variometers including slave magnets controlled by feedback compensation fields, the directional fields of said magnets being oriented in first and second directions that define a constant angle therebetween;

first and second generating means for generating first and second primary compensation fields in said first and second variometers, respectively, said first and second primary compensation fields compensating the horizontal component of the terrestrial magnetic field normal to the direction of the directional field of the variometer associated therewith;

first and second measuring means for measuring the electrical currents required to create respective ones of said first and second primary compensation fields;

means for generating feedback compensation fields for said first and second variometers, after the first and second primary compensation fields have been established, said feedback fields compensating for variations in the terrestrial field components;

means for computing the magnitude of the horizontal component of the terrestrial magnetic field and the direction thereof with reference to said device, as a function of the outputs of said first and second measuring means and as a function of said constant angle; and means for computing the variations in said components from the feedback compensation fields.

2. A device as claimed in claim 1 wherein said constant angle is a right angle.

3. A device as claimed in claim 2 further comprising third and fourth generating means for generating first and second secondary compensation fields in said first and second variometers, respectively, said secondary compensation fields being parallel to the direction of the directional field of the variometer associated therewith, and the magnitude of the secondary compensation field for said first variometer being equal to the magnitude of the primary compensation field for said second variometer and the magnitude of the secondary compensation field for said second variometer being equal to the magnitude of the primary compensation field for said first variometer, so as to provide compensation for each of said first and second variometers with respect to the horizontal component of the terrestrial magnetic field parallel to the directional fields thereof.

4. A device as claimed in claim 2 wherein said first and second generating means include; detection means for detecting the direction of rotation of said slaved magnets when said magnets are released from the inoperative positions thereof along the respective directions of the directional fields and subjected to the terrestrial magnetic field alone, and for determining from said detected directions of rotation the directions of said first and second primary compensation fields.

5. A device as claimed in claim 4 wherein said first and second generating means further comprise means for varying the magnitude of said first and second primary compensation fields, said magnitude varying means being operative subsequent to the determination by said detection means of the directions of said first and second primary compensation fields and said varying means being locked in the position corresponding to the point where said primary compensation fields are respectively equal in magnitude to the horizontal components of the terrestrial magnetic field to be compensated.

6. A device as claimed in claim 5 wherein said means for computing the magnitude of the horizontal components comprises data calculation means for receiving the outputs of said first and second measuring means after said varying means have been locked for calculating horizontal terrestrial magnetic field components from said outputs.

7. A device as claimed in claim 5 wherein the means for computing the variations in the components comprises calculation means for receiving data corresponding to the feedback compensation fields occuring in both variometers, after said varying means have been locked, for calculating variations of the horizontal terrestrial magnetic components.

* * * * *